United States Patent
Paseuth et al.

(10) Patent No.: US 11,130,181 B2
(45) Date of Patent: Sep. 28, 2021

(54) SURFACE-COATED CUTTING TOOL AND METHOD FOR MANUFACTURING THE SAME

(71) Applicants: Sumitomo Electric Hardmetal Corp., Itami (JP); Sumitomo Electric Industries, Ltd., Osaka (JP)

(72) Inventors: Anongsack Paseuth, Sorachi-gun (JP); Yasuki Kido, Sorachi-gun (JP); Shinya Imamura, Sorachi-gun (JP); Koji Kuramochi, Itami (JP)

(73) Assignees: Sumitomo Electric Hardmetal Corp., Itami (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/489,292

(22) PCT Filed: Jul. 11, 2017

(86) PCT No.: PCT/JP2017/025247
§ 371 (c)(1),
(2) Date: Aug. 27, 2019

(87) PCT Pub. No.: WO2018/158976
PCT Pub. Date: Sep. 7, 2018

(65) Prior Publication Data
US 2020/0061716 A1    Feb. 27, 2020

(30) Foreign Application Priority Data

Feb. 28, 2017   (JP) .............................. JP2017-037377

(51) Int. Cl.
*B23B 27/14*   (2006.01)
*B23C 5/16*    (2006.01)
(Continued)

(52) U.S. Cl.
CPC ................ *B23B 27/14* (2013.01); *B23C 5/16* (2013.01); *B23G 5/06* (2013.01); *C23C 16/303* (2013.01); *C23C 16/347* (2013.01); *C23C 30/005* (2013.01)

(58) Field of Classification Search
CPC ........... B23B 27/14; C23C 5/16; C23C 16/36; C23C 16/347; C23C 16/56
(Continued)

(56) References Cited

U.S. PATENT DOCUMENTS 4,334,928 A    6/1982 Hara et al.
2009/0123779 A1    5/2009 Endler
(Continued)

FOREIGN PATENT DOCUMENTS

EP    3091102 A1    11/2016
EP    3444052 A1    2/2019
(Continued)

OTHER PUBLICATIONS

Pitonak et al "Novel TiAlN Coating by Medium Temperature Low Pressure CVD" Proc of !8th Plansee Seminar HM37 p. 1-12 (Year: 2003).*
(Continued)

*Primary Examiner* — Archene A Turner
(74) *Attorney, Agent, or Firm* — Baker Botts L.L.P.; Michael A. Sartori

(57) ABSTRACT

A surface-coated cutting tool includes a substrate and a coating formed on a surface of the substrate, the coating including one or two or more layers, at least one of the layers being an Al-rich layer including hard particles, the hard particle having a sodium chloride type crystal structure, and including a first unit phase in a form of a plurality of lumps and a second unit phase interposed between the lumps of the first unit phase, the first unit phase being composed of a
(Continued)

nitride or carbonitride of $Al_xTi_{1-x}$, the first unit phase having an atomic ratio x of Al of 0.7 or more and 0.96 or less, the second unit phase being composed of a nitride or carbonitride of $Al_yTi_{1-y}$, the second unit phase having an atomic ratio y of Al exceeding 0.5 and less than 0.7.

6 Claims, 4 Drawing Sheets

(51) Int. Cl.
    *B23G 5/06*         (2006.01)
    *C23C 16/30*       (2006.01)
    *C23C 16/34*       (2006.01)
    *C23C 30/00*       (2006.01)

(58) Field of Classification Search
    USPC .......... 51/307, 309; 428/325, 697, 698, 699;
                                        427/255, 255.28, 255.394
    See application file for complete search history.

(56) References Cited

U.S. PATENT DOCUMENTS

| | | |
|---|---|---|
| 2010/0233511 A1 | 9/2010 | Endler et al. |
| 2012/0201615 A1 | 8/2012 | Ni et al. |
| 2012/0219789 A1 | 8/2012 | Endler et al. |
| 2015/0064452 A1 | 3/2015 | Pitonak et al. |
| 2016/0333473 A1* | 11/2016 | Stiens .................... C23C 16/46 |
| 2017/0021429 A1 | 1/2017 | Paseuth et al. |
| 2017/0297117 A1 | 10/2017 | Tatsuoka et al. |
| 2018/0093331 A1 | 4/2018 | Paseuth et al. |
| 2018/0133805 A1 | 5/2018 | Paseuth et al. |

FOREIGN PATENT DOCUMENTS

| | | | |
|---|---|---|---|
| JP | 2008-545063 A | 12/2008 | |
| JP | 2014-129562 A | 7/2014 | |
| JP | 2015-052133 A | 3/2015 | |
| JP | 2015-509858 A | 4/2015 | |
| JP | 2016-64485 A | 4/2016 | |
| JP | 2016-130343 A | 7/2016 | |
| JP | 6037256 B1 | 12/2016 | |
| JP | 6045010 B1 | 12/2016 | |
| WO | 2017/016826 A1 | 2/2017 | |

OTHER PUBLICATIONS

J. Todt et al., Al-rich cubic A10.8Ti0.2N coating with self-organized nano-lamellar microstructure: Thermal and mechanical properties, Surface and Coating Technology, 2016, vol. 291, pp. 89-93.

U.S. Appl. No. 16/489,303, filed Aug. 27, 2019.

U.S. Appl. No. 16/489,312, filed Aug. 27, 2019 .

Office Action issued in U.S. Appl. No. 16/489,312 dated Aug. 20, 2020.

Office Action issued in U.S. Appl. No. 16/489,303 dated Aug. 20, 2020.

Todt et al., "Superior oxidation resistance, mechanical properties and residual stresses of an Al-rich nanolamellar Ti0.05Al0.95N coating prepared by CVD," Surface & Coatings Technology, 258 (2014) 1119-1127 [Cited in OA issued in counterpart EP Patent Application dated Sep. 28, 2020].

Notice of Allowance issued in U.S. Appl. No. 16/489,303 dated Feb. 10, 2021.

Notice of Allowance issued in U.S. Appl. No. 16/489,312 dated Feb. 10, 2021.

Paseuth et al., "Deposition and analysis of Al-rich c-AlxTi1-xN coating with preferred orientation," Journal of American Ceramin Society, 2017; 100; pp. 343-353. [Cited in OA issued in EP Patent Application dated Mar. 23, 2021].

Johnson et al., "Spinodal decomposition of Ti0.33Al0.67N thin films studied by atom probe tomography," Thin Solid Films, 2012, 520, pp. 4362-4368. [Cited in OA issued in EP Patent Application dated Mar. 23, 2021].

Horling et al., "Thermal stability of arc evaporated high aluminum-content Ti1-xAlxN thin films," Journal of Vacuum Science and Technology A, 2002, 20(5), pp. 1815-1823. [Cited in OA issued in EP Patent Application dated Mar. 23, 2021].

Notice of Allowance issued in U.S. Appl. No. 16/489,312 dated May 28, 2021.

* cited by examiner

SURFACE-COATED CUTTING TOOL AND METHOD FOR MANUFACTURING THE SAME

TECHNICAL FIELD

The present invention relates to a surface-coated cutting tool and a method for manufacturing the same. The present application claims priority based on Japanese Patent Application No. 2017-037377 filed on Feb. 28, 2017. The entire contents of the Japanese patent application are incorporated herein by reference.

BACKGROUND ART

Japanese National Patent Publication No. 2008-545063 (Patent Literature 1) discloses as a surface coated member a member having a $Ti_{1-x}Al_xN$ coating. This $Ti_{1-x}Al_xN$ coating has a stoichiometric coefficient of $0.75<x\leq0.93$, and has a lattice constant a of 0.412-0.405 nm and a single-phase cubic NaCl structure. The $Ti_{1-x}Al_xN$ coating is formed through CVD (Chemical Vapor Deposition). More specifically, a first gaseous mixture composed of $AlCl_3$, $TiCl_4$, $H_2$ and Ar, and a second gaseous mixture composed of $NH_3$ and $N_2$ are introduced into a hot wall type CVD reactor with a substrate accommodated therein to grow a crystal of $Ti_{1-x}Al_xN$. The coating formed by this method has a higher content ratio of Al than a $Ti_{1-x}Al_xN$ coating produced in a known PVD method. For this reason, it is supposed that a surface coated member having the coating has high oxidation resistance and high hardness, and can exhibit excellent abrasion resistance at high temperature.

Japanese Patent Laying-Open No. 2014-129562 (Patent Literature 2) discloses a surface coated member. The surface coated member has a hard coating layer formed through CVD. The hard coating layer includes hard particles, and the hard particle includes a multilayer structure in which an AlTiN layer in a NaCl structure with a relatively high atomic ratio of Ti and an AlTiN layer in a NaCl structure with a relatively low atomic ratio of Ti are repeatedly stacked (a so-called lamellar phase). The lamellar phase has a layer stacking period of 0.5 to 20 nm. The hard coating layer has an indentation hardness equal to or greater than 3000 kgf(s)/mm² (29.4 GPa) and thus has high hardness, and the surface coated member of Patent Literature 2 can thus exhibit excellent abrasion resistance.

CITATION LIST

Patent Literature

PTL 1: Japanese National Patent Publication No. 2008-545063
PTL 2: Japanese Patent Laying-Open No. 2014-129562

SUMMARY OF INVENTION

A surface-coated cutting tool in one aspect of the present disclosure is a surface-coated cutting tool comprising a substrate and a coating formed on a surface of the substrate, the coating including one or two or more layers, at least one of the layers being an Al-rich layer including hard particles, the hard particle having a sodium chloride type crystal structure, and including a first unit phase in a form of a plurality of lumps and a second unit phase interposed between the lumps of the first unit phase, the first unit phase being composed of a nitride or carbonitride of $Al_xTi_{1-x}$, the first unit phase having an atomic ratio x of Al of 0.7 or more and 0.96 or less, the second unit phase being composed of a nitride or carbonitride of $Al_yTi_{1-y}$, the second unit phase having an atomic ratio y of Al exceeding 0.5 and less than 0.7, the Al-rich layer exhibiting a maximum peak in the (220) plane when the Al-rich layer is analyzed through X-ray diffraction in a direction normal to a surface of the coating.

A method for manufacturing a surface-coated cutting tool in one aspect of the present disclosure is a method for manufacturing a surface-coated cutting tool including a substrate and a coating formed on a surface of the substrate, the coating including one or two or more layers, at least one of the layers being an Al-rich layer including hard particles, the Al-rich layer exhibiting a maximum peak in the (220) plane when the Al-rich layer is analyzed through X-ray diffraction in a direction normal to a surface of the coating, the method comprising the steps of: forming the Al-rich Layer, the step of forming the Al-rich layer including a first step of forming a lamellar layer through CVD, and a second step of annealing the lamellar layer to obtain the Al-rich layer, the second step including a temperature increasing step, an annealing step, and a cooling step, the temperature increasing step including an operation of increasing the temperature of the lamellar layer at a rate of 10° C./min. or more, the annealing step including an operation of annealing the lamellar layer at 700° C. or higher and 1200° C. or lower for 0.1 hour or more and 10 hours or less to obtain the Al-rich layer, the cooling step including an operation of rapidly cooling the Al rich layer at a rate of 20° C./min. or more.

DETAILED DESCRIPTION

Figure 1:
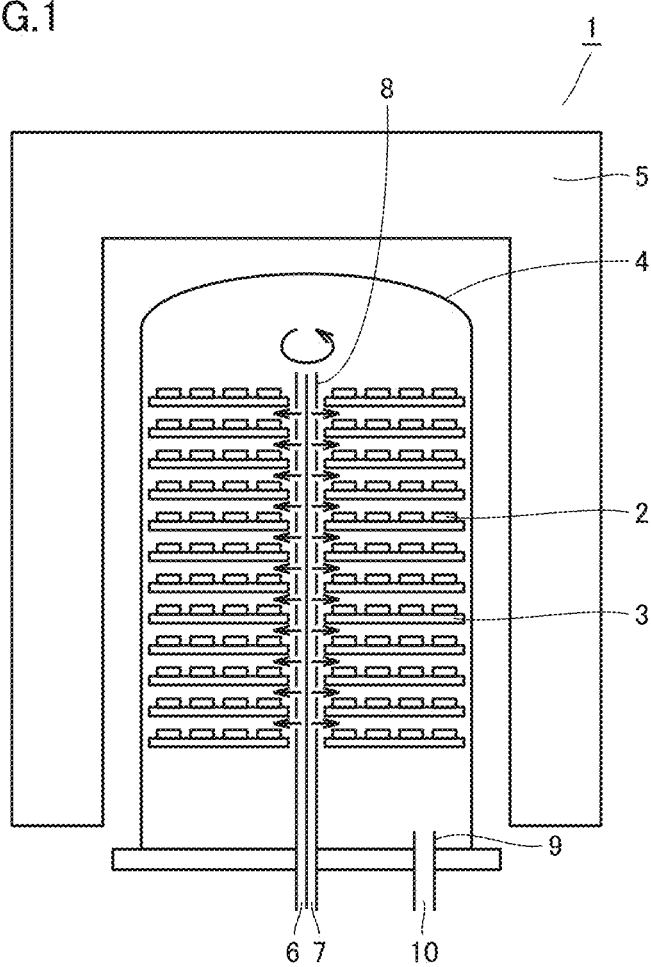
FIG. 1 is a schematic cross-sectional view of a CVD apparatus used in the present embodiment.

Problem to be Solved by the Present Disclosure

When the $Ti_{1-x}Al_xN$ coating of the surface coated member disclosed in Patent Literature 1 has x larger than 0.7, it has a large strain caused in a crystal structure of $Ti_{1-x}Al_xN$. Accordingly, when the coating receives energy, the $Ti_{1-x}Al_xN$ crystal makes phase transition to a more stable wurtzite type crystal structure. Accordingly, when the surface coated member is applied to a cutting tool and used in cutting, the heat caused in the cutting causes phase transition of the crystal structure of $Ti_{1-x}Al_xN$, which tends to cause a crack in the coating and when the crack extends it leads to a sudden fracture.

The surface coated member disclosed in Patent Literature 2 has room for improvement in terms of initial abrasion when it is used for a cutting tool. Although the cause is unknown, it is considered as follows: while the lamellar phase in the hard particle is excellent in deformation resistance in the layer stacking direction, it easily has dislocation in the longitudinal direction when an external load is received. The dislocation serves as a starting point to destruct the lamellar phase, which leads to destruction of the hard particle and hence develops initial abrasion. Thus a surface coated member which has high hardness and is also less likely to have initial abrasion has not been implemented, and there is a need for its development.

In view of the above, it is an object of the present disclosure to provide a surface-coated cutting tool which has high hardness and is less likely to have initial abrasion, and a method for manufacturing the same.

Advantageous Effect of the Present Disclosure

According to the above, a surface-coated cutting tool which has high hardness and is less likely to have initial abrasion can be provided.

Description of Embodiments

The present inventors, in diligently creating a coating to suppress initial abrasion, have arrived at applying a heat treatment to the lamellar phase that is disclosed in Patent Literature 2 to diffuse metal atoms such as Al in the lamellar phase. While conventionally it has been believed that a coating having undergone a heat treatment is degraded in quality, the present inventors have found that by performing a special control in the heat treatment to stop spinodal decomposition before the crystal grains constituting the lamellar phase make phase transition to the wurtzite crystal structure, a specific phase which suppresses initial abrasion can be formed inside the crystal grain.

Initially, embodiments of the present invention are enumerated and described.

[1] A surface-coated cutting tool in one aspect of the present disclosure is a surface-coated cutting tool comprising a substrate and a coating formed on a surface of the substrate, the coating including one or two or more layers, at least one of the layers being an Al-rich layer including hard particles, the hard particle having a sodium chloride type crystal structure, and including a first unit phase in a form of a plurality of lumps and a second unit phase interposed between the lumps of the first unit phase, the first unit phase being composed of a nitride or carbonitride of $Al_xTi_{1-x}$, the first unit phase having an atomic ratio x of Al of 0.7 or more and 0.96 or less, the second unit phase being composed of a nitride or carbonitride of $Al_yTi_{1-y}$, the second unit phase having an atomic ratio y of Al exceeding 0.5 and less than 0.7, the Al-rich layer exhibiting a maximum peak in the (220) plane when the Al-rich layer is analyzed through X-ray diffraction in a direction normal to a surface of the coating. Such a configuration allows the surface-coated cutting tool to have high hardness and also suppress initial abrasion.

[2] Preferably the hard particles occupy 50% by volume or more of the Al-rich layer. This can provide further higher hardness and also further suppress initial abrasion.

[3] Preferably the first unit phase has a size of 2 nm or more and 15 nm or less in the <100> orientation. This can provide still further higher hardness and also still further suppress initial abrasion.

[4] A method for manufacturing a surface-coated cutting tool in one aspect of the present disclosure is a method for manufacturing a surface-coated cutting tool including a substrate and a coating formed on a surface of the substrate, the coating including one or two or more layers, at least one of the layers being an Al-rich layer including hard particles, the Al-rich layer exhibiting a maximum peak in the (220) plane when the Al-rich layer is analyzed through X-ray diffraction in a direction normal to a surface of the coating, the method comprising the steps of: forming the Al-rich layer, the step of forming the Al-rich layer including a first step of forming a lamellar layer through CVD and a second step of annealing the lamellar layer to obtain the Al-rich layer, the second step including a temperature increasing step, an annealing step, and a cooling step, the temperature increasing step including an operation of increasing the temperature of the lamellar layer at a rate of 10° C./min. or more, the annealing step including an operation of annealing the lamellar layer at 700° C. or higher and 1200° C. or lower for 0.1 hour or more and 10 hours or less to obtain the Al-rich layer, the cooling step including an operation of rapidly cooling the lamellar layer at a rate of 20° C./min. or more. Such a configuration allows a surface-coated cutting tool to be manufactured which has higher hardness and is also less likely to have initial abrasion.

[5] Preferably, the first step includes a first operation of obtaining a mixture gas by mixing a first mixture gas and a second mixture gas at a temperature ranging from 650° C. to 850° C. with a pressure ranging from 0.5 kPa to 1.5 kPa applied and a second operation of ejecting the mixture gas toward a surface of the substrate at the temperature with the pressure applied to form the lamellar layer, and the first mixture gas includes $AlCl_3$ gas, $TiCl_4$ gas, and $H_2$ gas, and the second mixture gas includes $NH_3$ gas and Ar gas. This can provide a lamellar layer for forming an Al-rich layer which has further higher hardness and is further less likely to have initial abrasion.

[6] Preferably, the lamellar layer includes a third unit phase and a fourth unit phase, the third unit phase and the fourth unit phase are stacked alternately, the third unit phase is composed of a nitride or carbonitride of $Al_sTi_{1-s}$, the third unit phase has an atomic ratio s of Al of 0.7 or more and 0.95 or less, the fourth unit phase is composed of a nitride or carbonitride of $Al_tTi_{1-t}$, and the fourth unit phase has an atomic ratio t of Al of 0.5 or more and less than 0.7. This can provide an Al-rich layer which has further higher hardness and is further less likely to have initial abrasion.

Details of Embodiments of the Present Invention

Hereinafter, while an embodiment of the present invention (hereinafter also referred to as "the present embodiment") will be described in more detail, the embodiment is not limited as such. Hereinafter, it will be described with reference to the drawings.

In the present specification, an expression in the form of "A-B" means a range's upper and lower limits (that is, A or more and B or less), and when A is not accompanied by any unit and B is alone accompanied by a unit, A has the same unit as B. Furthermore, in the present specification, when a compound or the like is represented by a chemical formula without specifying any specific atomic ratio, it includes any conventionally known atomic ratio and is not necessarily limited to those falling within the stoichiometric range. For example, for "TiBN," the ratio of the number of atoms constituting TiBN is not limited to Ti:B:N=1:0.5:0.5, and includes any conventionally known atomic ratio. This also applies to descriptions for compounds other than "TiBN." In the present embodiment, metallic elements such as titanium (Ti), aluminum (Al), silicon (Si), tantalum (Ta), chromium (Cr) and the like, and a nonmetallic element such as nitrogen (N), oxygen (O), carbon (C), or the like do not necessarily have to configure a stoichiometric composition.

<<Surface-Coated Cutting Tool>>

A surface-coated cutting tool according to the present embodiment includes a substrate and a coating formed on a surface of the substrate. The coating preferably coats the entire surface of the substrate. However, even if the substrate is partially uncoated with the coating or the coating is partially different in configuration, such does not depart from the scope of the present invention.

Such a surface coated cutting tool can be exemplified for example by drills, end mills, indexable cutting inserts for drills, indexable cutting inserts for end mills, indexable cutting inserts for milling, indexable cutting inserts for turning, metal saws, gear cutting tools, reamers, taps, and the like.

<Substrate>

The substrate can be any substrate conventionally known as a substrate of this type. For example, it is preferably any of a cemented carbide (for example, a WC-base cemented carbide or a material containing WC and in addition, Co, or a carbonitride of Ti, Ta, Nb, or the like added), a cermet (mainly composed of TiC, TiN, TiCN, or the like), a high-speed steel, a ceramic material (titanium carbide, silicon carbide, silicon nitride, aluminum nitride, aluminum oxide, and the like), a cubic crystal boron nitride sintered material, and a diamond sintered material.

Of these various types of substrates, it is particularly preferable to select a WC-based cemented carbide or a cermet (a TiCN-base cermet, in particular). This is because these substrates are particularly excellent in balance between hardness and strength at high temperature and have excellent characteristics as a substrate of a surface coated cutting tool for the above-described applications.

When the surface coated cutting tool is an indexable cutting insert or the like, the substrate also includes a substrate with or without a chip breaker. Furthermore, when cutting a workpiece, a cutting edge has a ridge line portion serving as a center for cutting, which has a shape also including a sharp edge (a ridge formed by a rake face and a flank face), a honed edge (a sharp edge rounded), a negative land (with beveling applied), and a combination of honing and the negative land.

<Coating>

The coating includes one or two or more layers. At least one of the layers is an Al-rich layer including hard particles. Preferably, the coating has a thickness of 3 to 30 μm. When the thickness is less than 3 μm, abrasion resistance tends to be insufficient. When the thickness exceeds 30 μm, the coating tends to peel off or break during intermittent working when a large stress is applied between the coating and the substrate.

(Another Layer)

The coating may include another layer insofar as the coating includes at least one Al-rich layer. The other layer can for example be an $Al_2O_3$ layer, a $TiB_2$ layer, a TiBN layer, an AlN layer (wurtzite type), a TiN layer, a TiCN layer, a TiBNO layer, a TiCNO layer, a TiAlN layer, a TiAlCN layer, a TiAlON layer, a TiAlONC layer, or the like.

For example, including a TiN layer, a TiC layer, a TiCN layer, or a TiBN layer as an underlying layer directly on the substrate can enhance adhesion between the substrate and the coating. By including an $Al_2O_3$ layer, the coating can be enhanced in oxidation resistance. Furthermore, including an outermost layer made of a TiN layer, a TiC layer, a TiCN layer, a TiBN layer or the like can provide identification of whether the surface-coated cutting tool has a used cutting edge. The other layer preferably has a thickness of 0.1 to 10 μm.

<Al-Rich Layer>

As has been described above, the coating is composed of one or two or more layers with at least one thereof being an Al-rich layer including hard particles. The Al-rich layer suitably has a thickness of 1 μm or more and 20 μm or less, more preferably 3 μm or more to 15 μm or less. When the Al rich layer has a thickness less than 1 μm, abrasion resistance tends to be insufficient. When the Al rich layer has a thickness exceeding 20 μm, the Al rich layer tends to peel off or break during intermittent working when a large stress is applied between the Al rich layer and the substrate. Insofar as the present invention exhibits its effect(s), an Al-rich layer partially including a phase composed of other than hard particles, as will be described hereinafter, e.g., an amorphous phase or a wurtzite hard phase, does not depart from the scope of the present invention. Herein, being "Al-rich" in the Al-rich layer means that the layer at any five portions has a metal composition with an Al content exceeding 0.5 on average.

The Al-rich layer, the other layer, and the coating can be measured in thickness as follows: the surface-coated cutting tool is cut parallel to the direction normal to a surface of the substrate to obtain a cross-sectional sample which is in turn observed with a transmission electron microscope (TEM (trade name: "JEM-2100F" manufactured by JEOL Ltd.)). Furthermore, the Al-rich layer, the other layer, and the coating can be measured in thickness for example by obtaining five cross-sectional samples, measuring thickness at any three locations in each sample, and representing an average value thereof as the thickness. When observing the thickness of Al rich layer and the thickness of other layer, adjustment is made to provide an observation magnification of 50000 times and an observation area of about 10 μm² for one field of view. When observing the thickness of the coating, adjustment is made to provide an observation magnification of 5000 times and an observation area of about 100 μm² for one field of view.

A known method can be used to obtain a cross-sectional sample of the surface-coated cutting tool. Inter alia, it is preferable to prepare the cross-sectional sample by Ga ions (acceleration voltage: 30 kV) using a focused ion beam apparatus (trade name: "JIB-4501" manufactured by JEOL Ltd.).

<Hard Particle>

The hard particle has a sodium chloride type crystal structure, and includes a first unit phase in the form of a plurality of lumps and a second unit phase interposed between the lumps of the first unit phase. The first unit phase is composed of a nitride or carbonitride of $Al_xTi_{1-x}$, and has an atomic ratio x of Al of 0.7 or more and 0.96 or less. Furthermore, when the nitride of $Al_xTi_{1-x}$ is represented as $Al_xTi_{1-x}N_{z1}$, a relationship of $0.8 \leq z1 \leq 1.2$ is satisfied. When the carbonitride of $Al_xTi_{1-x}$ is represented as $Al_xTi_{1-x}C_{m1}N_{n1}$, a relationship of $0.8 \leq m1+n1 \leq 1.2$ is satisfied.

The second unit phase is composed of a nitride or carbonitride of $Al_yTi_{1-y}$, and has an atomic ratio y of Al exceeding 0.5 and less than 0.7. Furthermore, when the nitride of $Al_yTi_{1-y}$ is represented as $Al_yTi_{1-y}N_{z2}$, a relationship of $0.8 \leq z2 \leq 1.2$ is satisfied. When the carbonitride of $Al_yTi_{1-y}$ is represented as $Al_yTi_{1-y}C_{m2}N_{n2}$, a relationship of $0.8 \leq m2+n2 \leq 1.2$ is satisfied.

Figure 3:
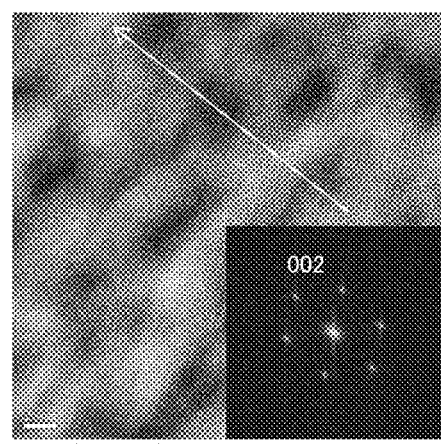
FIG. 3 is a photograph as a substitute for a drawing for illustrating as a microscopic image obtained with a transmission electron microscope (TEM) hard particles in an Al rich layer formed in a surface coated cutting tool of the present embodiment.

The hard particle has the first unit phase in the form of the plurality of lumps and the second unit phase interposed between the lumps of the first unit phase, for example as shown in a microscopic image shown in FIG. 3. Note that FIG. 3 shows an image obtained through a transmission electron microscope (TEM) with a hard particle in the Al rich layer in the above described cross-sectional sample as a target. This microscopic image is captured using a High-Angle Annular Dark-field (HAADF) method. In FIG. 3, light and dark appear depending on the atomic ratio of Al. Specifically, a location with a higher atomic ratio of Al appears darker. Therefore, a darker portion will be the first unit phase, and a brighter portion will be the second unit phase.

In FIG. 3, as a cross-sectional structure internal to the hard particle, there appears a form in which the second unit phase in the form of a thin line surrounds the first unit phase in the form of lumps. That is, the hard particle internally has a structure in which the second unit phase in the form of a thin line surrounds the first unit phase in the form of a plurality of lumps. Further, by observing the FIG. 3 TEM image, it can be seen that the hard particle has the first unit phase and the second unit phase both having a sodium chloride type crystal structure, as has been described above, with the first and second unit phases lattice-matched.

While the first and second unit phases preferably each change in composition along the <100> orientation of the hard particle (a direction indicated in FIG. 3 by an arrow), they may each have a single composition. Hereinafter, a case where the hard particle has the first unit phase and the second unit phase each changing in composition along its <100> orientation will be referred to describe how they change in composition with reference to FIG. 4.

Figure 4:
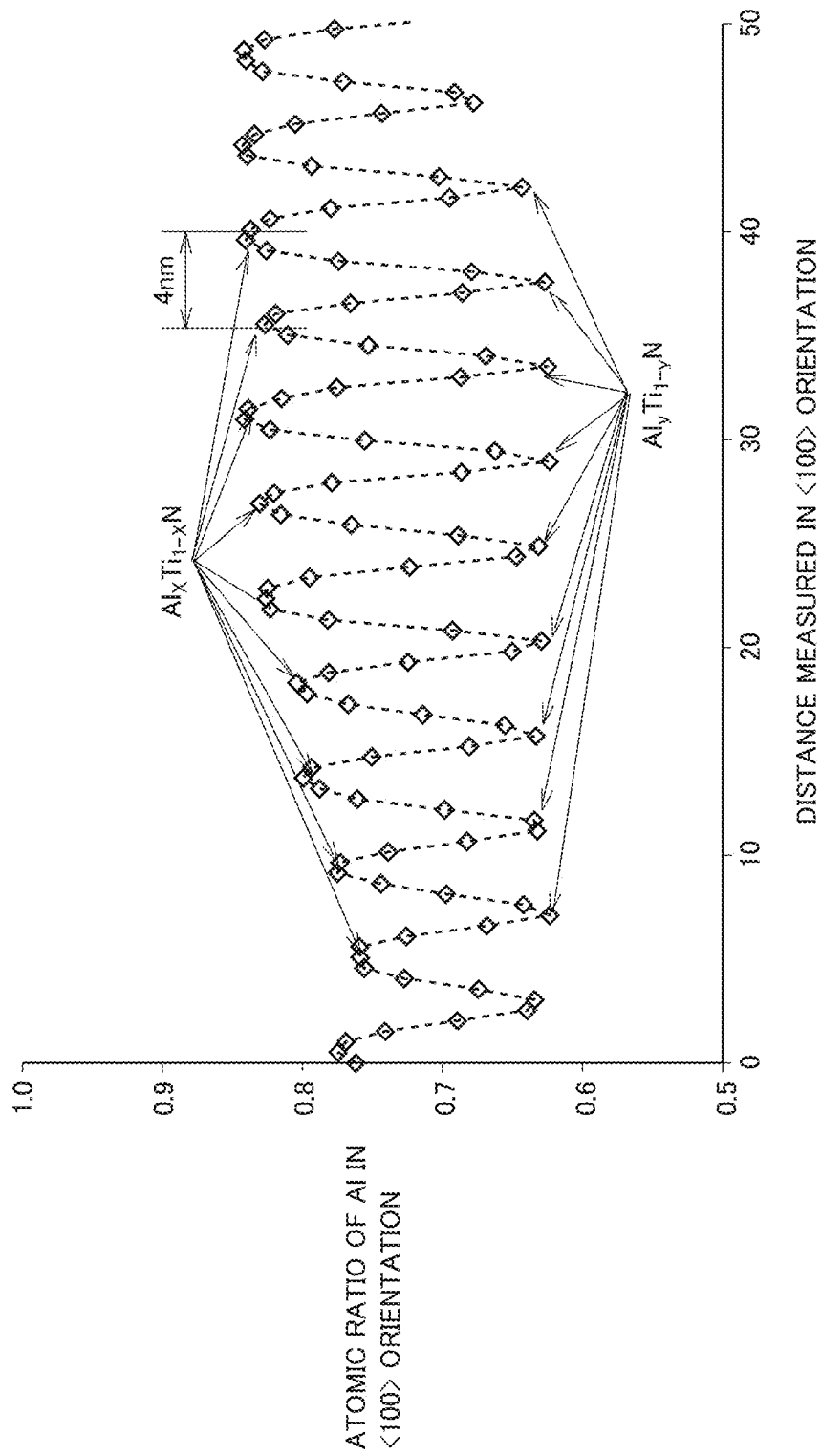
FIG. 4 is a graph representing a relationship between a distance measured in a direction indicated in FIG. 3 by an arrow (i.e., the <100> orientation) and an atomic ratio of Al, as obtained through a composition analysis using an energy dispersive X-ray analyzer (EDX) in the <100> orientation.

FIG. 4 is a graph showing a result of a composition analysis in the direction indicated in FIG. 3 by the arrow (i.e., the <100> orientation) by using an energy dispersive X-ray spectroscopy (EDX) apparatus (trade name: "JED-2300" manufactured by JEOL Ltd.) accompanying the above transmission electron microscope (TEM). The FIG. 4 graph has a horizontal axis representing a distance measured in the direction indicated by the arrow (the <100> orientation), and a vertical axis representing an atomic ratio of Al (Al/(Al+Ti)). And FIG. 4 shows how the atomic ratio of Al changes along the <100> orientation, that is, how the hard particle's internal composition changes along the <100> orientation. An analysis using the EDX apparatus allows a calculation of a composition ratio of atoms present at the analyzed location. In FIG. 4, the first unit phase has an atomic ratio of Al occupying a range of 0.7 or more and 0.96 or less. The second unit phase has an atomic ratio of Al occupying a range of more than 0.5 and less than 0.7. That is, the first unit phase and the second unit phase are distinguished with an atomic ratio of Al of 0.7 serving as a boundary.

Furthermore, the first unit phase includes a composition of a nitride or carbonitride of $Al_xTi_{1-x}$ in which the atomic ratio of Al is 0.7 or more and maximized (or peaks). For example, in FIG. 4, as seen from a side with a smaller distance measured along the <100> orientation, the atomic ratio of Al has peaks at 0.78, 0.76, 0.78, 0.8, 0.8, 0.83, 0.84, 0.85, 0.84, 0.85, 0.85, 0.85. The first unit phase has an atomic ratio of Al gradually decreasing from these peaks toward the second unit phase adjacent to the first unit phase.

The second unit phase includes a nitride or carbonitride of $Al_yTi_{1-y}$ in which the atomic ratio of Al is less than 0.7 and minimized (or forms valleys). For example, in FIG. 4, as seen from the side with a smaller distance measured along the <100> orientation, the atomic ratio of Al has valleys of 0.63, 0.62, 0.63, 0.63, 0.63, 0.63, 0.62, 0.63, 0.63, 0.64, 0.68. The second unit phase has an atomic ratio of Al gradually increasing from these valleys toward the first unit phase adjacent to the second unit phase.

The hard particle preferably has the first unit phase with a size of 2 nm or more and 15 nm or less in the <100> orientation. This size means a distance along the <100> orientation from a middle point of the first unit phase through the second unit phase adjacent thereto to a middle point of the first unit phase adjacent to the second unit phase. That is, the hard particle, in a structure with the second unit phase in the form of a thin line surrounding the first unit phase in the form of a plurality of lumps, has one cycle of 2 nm or more and 15 nm or less for the first and second unit phases along the <100> orientation.

The first unit phase is difficult to produce if it has a size of less than 2 nm in the <100> orientation. If the size exceeds 15 nm, a probability of phase transition to a wurtzite crystal structure increases, and accordingly, the coating is likely to be cracked, and the crack tends to be developed resulting in a sudden fracture. More preferably, the first unit phase of the hard particle has a size of 2 nm or more and 10 nm or less in the <100> orientation.

The size of the first unit phase in the <100> orientation can be determined from a TEM image with a hard particle of the above-described cross-sectional sample as a target. The TEM image is adjusted with an observation magnification of 5000000 times and an observation area of about 150 nm² so that 1 to 10 hard particles appear in one field of view. By observing this in ten different fields of view, an average value thereof can be determined as the size of the first unit phase in the <100> orientation.

While in the structure with the second unit phase in the form of a thin line surrounded by the first unit phase in the form of a plurality of lumps, the number of lumps of the first unit phase surrounded by the second unit phase in the <100> orientation should not be particularly limited, preferably the number is 10 or more and 1000 or less. If the number is less than 10, the number of lumps of the first unit phase is too small, and the Al-rich layer including the hard particles tends to be decreased in hardness. On the other hand, if the number exceeds 1000, the structure with the second unit phase surrounding the first unit phase can no longer be substantially formed, and the Al-rich layer tends to be decreased in hardness.

The hard particle preferably has a particle diameter of 10 nm or more and 1000 nm or less. When the hard particle has a particle diameter less than 10 nm, it will be difficult to produce hard particles in the above-described form. When the hard particle has a particle diameter exceeding 1000 nm, it tends to invite escaping of the hard particle and chipping thereof accompanying the escaping. The particle diameter of the hard particle can also be determined from the TEM image of the cross-sectional sample described above. The TEM image is adjusted with an observation magnification of 50000 times and an observation area of about 10 μm² so that 10 to 100 crystal grains appear in one field of view. The particle diameter of the hard particle can be specifically measured as follows:

Initially, when the Al-rich layer appearing in one field of view of the TEM image as described above has a thickness t, thickness t is equally divided into 10 portions in the direction of the thickness to select a range of 0.1t to 0.9t. Further, in this range, seven straight lines having a predetermined length and equally spaced are set perpendicular to a direction of growth of hard particles (a direction traversing a surface of the substrate at an angle of 45° in the present embodiment). Subsequently, the number of hard particles traversing these straight lines is determined. Finally, a numerical value obtained by dividing the predetermined length by the number of hard particles traversing these straight lines is defined as the particle diameter of the hard particles in that field of view. This can be done for TEM images of three different fields of view, respectively, and their average value can be determined as the particle diameter of the hard particles. The hard particle more preferably has a particle diameter of 50 nm or more and 500 nm or less.

Insofar as the present invention exhibits its effect(s), the hard particle does not depart from the scope of the present invention, whether the hard particle may internally include a structure other than the structure having the second unit phase in the form of a thin line surrounding the first unit phase in the form of a plurality of lumps, e.g., an amorphous phase, a wurtzite hard phase, or the like, or may have the first unit phase partially not surrounded by the second unit phase in the form of a thin line.

Herein, the hard particles preferably occupy 50% by volume or more of the Al-rich layer. The hard particles more preferably occupy 60% by volume or more, most preferably 80% by volume or more of the Al rich layer. Thus, by including the Al-rich layer, the coating can have higher hardness and further suppress initial abrasion. When the Al-rich layer has hard particles at a ratio of less than 50% by volume, it is difficult to obtain an effect of suppressing initial abrasion. The upper limit of the ratio of hard particles in the Al-rich layer is 95% by volume.

The ratio (vol %) of hard particles in the Al-rich layer can be measured as follows: Initially the cross-sectional sample described above is used to obtain a TEM image including a boundary (or an interface) of the Al rich layer closer to the substrate and a boundary (or an interface) of the Al rich layer closer to a surface within one field of view (with an observation magnification of about 50000 times and an observation area of about 10 μm$^2$). Subsequently, based on the TEM image, the Al-rich layer's total area (S1) and the hard particles' total area (S2) are determined, and an area ratio of the hard particles' total area (S2) to the Al-rich layer's total area (S1) (i.e., S2/S1×100) is calculated. Furthermore, this measurement is performed for TEM images of three different fields of view, and an average value of these is obtained as an area ratio of the hard particles in the Al-rich layer. Finally, the area ratio of the hard particles in the Al-rich layer is also regarded as continuing in the direction along the depth of the Al-rich layer, and this is defined as a volume ratio of the hard particles in the Al-rich layer.

<Diffraction Peak>

In the present embodiment, when the Al-rich layer is analyzed through X-ray diffraction in a direction normal to a surface of the coating, the Al-rich layer exhibits a maximum peak in the (220) plane. From this, it is understood that, in the surface-coated cutting tool, a majority of the hard particles included in the Al-rich layer are crystals grown in a direction inclined relative to the direction normal to the surface of the coating by 45° rightward or leftward. Thus, the surface-coated cutting tool can effectively have high hardness and suppress initial abrasion. Furthermore, it presents a maximum peak in the (220) plane, and can have hardness and toughness in a good balance hence be more excellent in abrasion resistance. Specifically, the Al-rich layer is subjected to X-ray diffraction (XRD) in the following method:

First, an object to be measured through X-ray diffraction, or a surface-coated cutting tool, is set in an X-ray diffractometer (trade name: "SmartLab®" manufactured by Rigaku Corporation) in a direction analyzable from the direction normal to a surface of the coating. In doing so, when the surface-coated cutting tool has an outermost layer coating the coating on a side closer to the surface than the Al-rich layer, the coating of the surface-coated cutting tool has a surface ground to expose a surface of the Al-rich layer and the cutting tool is thus set in the X-ray diffractometer. A known method can be used to grind the surface of the coating.

Subsequently, the surface-coated cutting tool has the Al-rich layer analyzed in the direction normal to the surface of the coating under conditions indicated below. Thus, data of X-ray diffraction peaks in the Al-rich layer (hereinafter, also referred to as "XRD data") can be obtained.

Measurement method: ω/2θ method
Incident angle (ω): 2°
Scan angle (2θ): 30° to 70°
Scan speed: 1°/min.
Scan step width: 0.05°
X-ray source: Cu-Kα ray
Optical system's attribute: collimated beam of medium resolution
Tube voltage: 45 kV
Tube current: 200 mA
X-ray irradiation range: using a collimator limited in range to 2.0 mm to irradiate the rake face in a range of 2 mm in diameter (Note: Irradiating the flank face with x ray under the same conditions is also permitted.)
X-ray detector: semiconductor detector (trade name: "D/teX Ultra 250" manufactured by Rigaku Corporation)

Figure 5:
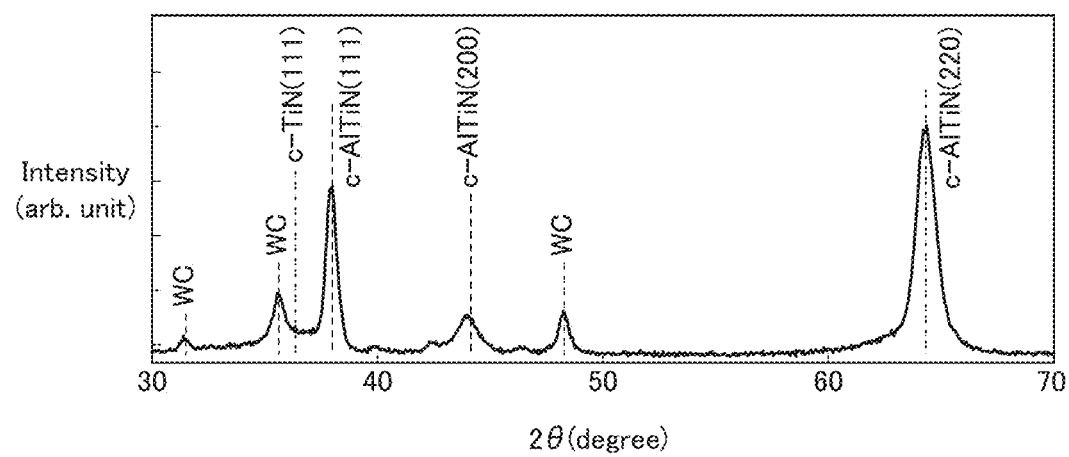
FIG. 5 is a graph representing a relationship between 2θ and each crystal plane's diffraction intensity, as obtained by analyzing the Al-rich layer of FIG. 3 in a direction normal to a surface of the Al rich layer through X-ray diffractometry.

In the present embodiment, the XRD data of the Al-rich layer presents as a maximum peak the (220) plane of the hard particles included in the Al-rich layer, for example as shown in FIG. 5. Specifically, in FIG. 5, it is understood that the peak of the (220) plane of c-AlTiN appears with higher intensity than the other planes.

When the surface-coated cutting tool is coated with a coating including the Al-rich layer in the above-described form, the reason why it can suppress initial abrasion is unknown in detail. However, it is estimated as follows: That is, it is believed that the Al-rich layer that transforms into the first unit phase in the form of a plurality of nano-sized lumps and the second unit phase interposed between the lumps of the first unit phase significantly inhibits dislocation movement caused by external stress, and can thus suppress cracking in the coating in an early cutting stage, and also effectively suppress development of cracking toward the substrate when cracking is caused. Furthermore, the coating will have a granular structure in which the (200) plane is a maximum peak in XRD analyzed in the direction normal to the surface of the coating, and it is believed that the coating is enhanced in toughness and helps to enhance an effect to further suppress initial abrasion.

(Indentation Hardness)

In the surface-coated cutting tool according to the present embodiment, the coating can have an indentation hardness (hereinafter also referred to as "coating strength") of 30 GPa (about 3000 kgf/mm$^2$) or more. The coating more preferably has an indentation hardness of 35 GPa. The coating having an indentation hardness falling within the above range allows the surface-coated cutting tool to have increased abrasion resistance. In particular, the cutting tool can exhibit excellent performance when cutting a hard-to-cut material such as a heat-resistant alloy. The upper limit of the indentation hardness of the coating is not particularly limited. For example, a coating having an indentation hardness of 30 to 38 GPa allows a sufficiently excellent balance between abrasion resistance and chipping resistance.

This indentation hardness can be measured using a nano-indentation method. Specifically, it is measured using an ultra-micro indentation hardness tester to which the nano-indentation method is applicable. The indentation hardness can be calculated as follows: an indenter is pushed into the coating by a predetermined load (for example of 30 mN) in a direction perpendicular to that of the thickness of the coating, and an indentation depth by which the indenter is thus pushed in the coating is used to calculate the indentation hardness. In particular, in measuring the indentation hardness of the Al-rich layer, if there is another layer such as an outermost layer on a surface of the coating, the Calo test, oblique lapping, or the like can be performed to remove the other layer to expose the Al-rich layer and the above method can be applied to the exposed Al-rich layer to measure its indentation hardness.

<Effect>

The surface-coated cutting tool according to the present embodiment that has a substrate coated with a coating having an Al-rich layer including hard particles as described above can have high hardness and be also effectively less likely to have initial abrasion. The surface-coated cutting tool can thus be stable and have a long life.

<<Method for Manufacturing Surface-Coated Cutting Tool>>

A method for manufacturing a surface-coated cutting tool according to the present embodiment is a method for manufacturing a surface-coated cutting tool comprising a substrate and a coating formed on a surface of the substrate, the coating including one or two or more layers with at least one thereof being an Al-rich layer including hard particles, the Al-rich layer exhibiting a maximum peak in the (220) plane when the Al-rich layer is analyzed through X-ray diffraction in a direction normal to a surface of the coating. The method for manufacturing the surface-coated cutting tool includes the step of forming an Al-rich layer. This step includes a first step of forming a lamellar layer through CVD, and a second step of annealing the lamellar layer to obtain the Al-rich layer. The second step includes a temperature increasing step, an annealing step, and a cooling step. The temperature increasing step includes an operation of increasing the temperature of the lamellar layer at a rate of 10° C./min. or more. The annealing step includes an operation of annealing the lamellar layer at 700° C. or higher and 1200° C. or lower for 0.1 hour or more and 10 hours or less to obtain the Al-rich layer. The cooling step includes an operation of rapidly cooling the lamellar layer at a rate of 20° C./min. or more.

The method for manufacturing a surface-coated cutting tool that includes the above-described steps and operations can manufacture a surface-coated cutting tool having high hardness and being also less likely to have initial abrasion. Insofar as the above steps are performed, the method for manufacturing the surface-coated cutting tool can include another step. The other step can for example be a substrate manufacturing step, a surface processing step such as surface-grinding, shot blasting and the like, a CVD step for forming another layer, and the like. The other step can be performed in a conventionally known method.

Herein, preferably, the "substrate," "coating," "Al-rich layer including hard particles," etc. included in the surface-coated cutting tool manufactured in the above-described manufacturing method are identical to the "substrate," "coating," "Al-rich layer including hard particles," described in the above <<surface-coated cutting tool>> section. Hereinafter, each type of step in the present embodiment will be described in detail.

<Step of Forming Al-Rich Layer>

(First Step)

As has been described above, the method for manufacturing a surface-coated cutting tool includes the step of forming an Al-rich layer. The step of forming the Al-rich layer includes a first step of forming a lamellar layer through CVD. The lamellar layer can be formed for example by using a CVD apparatus shown in FIG. 1. Herein, the lamellar layer is a layer including hard particles, and it is preferable that the hard particle includes a third unit phase and a fourth unit phase, as will be described hereinafter. The third unit phase and the fourth unit phase are alternately stacked in the hard particle to form a lamellar phase. In the present specification, such a configuration as described above may simply be represented as follows: "the lamellar layer includes a third unit phase and a fourth unit phase."

As shown in FIG. 1, CVD apparatus 1 is provided with a setting table allowing a plurality of substrate setting jigs 3 holding substrates 2 to be set thereon. Substrate 2 and substrate setting jig 3 set on the setting table are covered with a reaction chamber 4. Reaction chamber 4 is surrounded by a temperature control device 5. Temperature control device 5 controls temperature inside reaction chamber 4.

CVD apparatus 1 is provided with an introduction pipe 8 having two introduction ports 6 and 7. Introduction pipe 8 is disposed so as to penetrate the setting table on which substrate setting jig 3 is disposed. A plurality of through holes are formed in a portion near substrate setting jig 3. Introduction pipe 8 receives gases through introduction ports 6, 7, and the gases are not mixed therein and instead pass through the through holes and are thus introduced into reaction chamber 4. Introduction pipe 8 is rotatable about its axis. Further, CVD apparatus 1 is provided with an exhaust pipe 9 to externally discharge exhaust gas through an exhaust port 10. The jig and the like in reaction chamber 4 are normally made of graphite.

In the first step, it is preferable to perform the following first operation, second operation, and cooling operation using the above-described CVD apparatus. Thereby, a lamellar layer can be formed in the coating, and a cutting tool precursor including this lamellar layer can be obtained. Furthermore, before/after forming the lamellar layer, another layer, such as a TiN layer, an $Al_2O_3$ layer, or the like, can also be formed on the substrate using the above described CVD apparatus. As the substrate, any substrate conventionally known as this type of substrate can be used, and accordingly, can be produced in a conventionally known method.

[First Operation]

The first step preferably includes a first operation of obtaining a mixture gas by mixing a first mixture gas and a second mixture gas at 650° C. or higher and 850° C. or lower with 0.5 kPa or more and 1.5 kPa or less applied. In the first operation, a first mixture gas containing a source material gas containing Al, a source material gas containing Ti, and a carrier gas is introduced into CVD apparatus 1 through introduction port 6 and thus enters introduction pipe 8. The first mixture gas may contain a source material gas containing C (carbon).

Further, in the first operation, a second mixture gas containing a source material gas containing N and a carrier gas is introduced into CVD apparatus 1 through introduction port 7 and thus enters introduction pipe 8. Subsequently, the first mixture gas and the second mixture gas are ejected from introduction pipe 8 into reaction chamber 4 having an atmosphere of 650° C. or higher and 850° C. or lower and 0.5 kPa or more and 1.5 kPa or less, and thus mixed together to provide a mixture gas.

In particular, since introduction pipe 8 has a plurality of through holes, the first mixture gas and second mixture gas introduced are ejected into reaction chamber 4 through different through holes. While the first mixture gas and the second mixture gas are thus ejected, introduction pipe 8 is rotating about its axis as indicated in FIG. 1 by a rotating arrow. A mixture gas in which the first mixture gas and the second mixture gas are uniformly mixed together can thus be obtained. Hence, the mixture gas in which the first mixture gas and the second mixture gas are uniformly mixed together can be deposited in a second operation, which will be described hereinafter, on the side of a surface of substrate 2 set on substrate setting jig 3.

As the source material gas containing Al and the source material gas containing Ti, chloride gas of these can suitably be used. As the source material gas containing C, hydrocarbon gas, such as $CH_4$ and $C_2H_4$, can be suitably used, and as the source material gas containing N, nitrogen-containing gas, such as ammonium and $N_2$, can be suitably used. Specifically, preferably, the first mixture gas includes $AlCl_3$ gas, $TiCl_4$ gas, and $H_2$ gas. Furthermore, the first mixture gas can include $C_2H_4$ gas in addition to the above gases. The second mixture gas preferably includes $NH_3$ gas and Ar gas. The ratio of $NH_3$ gas in the mixture gas is preferably 1 to 2% by volume, more preferably 1 to 1.5% by volume.

Preferably, the first operation is performed in the reaction chamber having an atmosphere therein with a furnace having an internal temperature of 700° C. or higher and 800° C. or lower. Further, the furnace preferably has an internal pressure of 0.5 kPa or more and 1 kPa or less. This will allow the mixture gas to have the first mixture gas and the second mixture gas mixed together more uniformly.

[Second Operation]

The first step preferably includes a second operation of ejecting the mixture gas toward the surface of the substrate in the above-described temperature and pressure ranges to form a lamellar layer. In the second operation, the source materials (or elements) contained in the mixture gas is deposited on the surface of the substrate. Thus, a lamellar layer can be formed in the coating, and a cutting tool precursor including the lamellar layer can be obtained.

Preferably, the lamellar layer includes a third unit phase and a fourth unit phase. Preferably, the third unit phase and the fourth unit phase are stacked alternately. Specifically, the lamellar layer preferably has a multilayer structure in which the third unit phase and the fourth unit phase are repeatedly stacked. The third unit phase is composed of a nitride or carbonitride of $Al_sTi_{1-s}$, and has an atomic ratio s of Al of 0.7 or more and 0.95 or less. The fourth unit phase is composed of a nitride or carbonitride of $Al_tTi_{1-t}$, and has an atomic ratio t of Al of 0.5 or more and less than 0.7.

Figure 2:
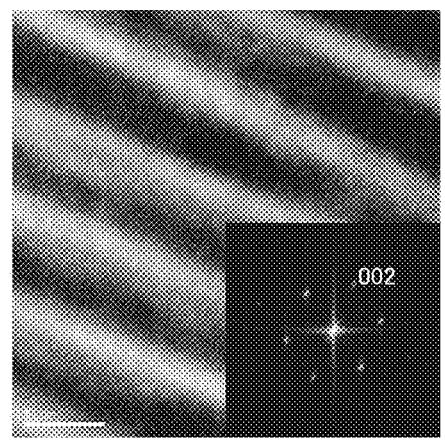
FIG. 2 is a photograph as a substitute for a drawing for illustrating as a microscopic image obtained with a transmission electron microscope (TEM) a lamellar phase formed in a manufacturing method according to the present embodiment.

For example, as shown in FIG. 2, the lamellar layer has a multilayer structure composed of the third unit phase and the fourth unit phase stacked repeatedly, the third unit phase appearing dark as it has an atomic ratio of Al (Al/(Al+Ti)) which is relatively high, the fourth unit phase appearing bright as it has an atomic ratio of Al which is lower than that of the third unit phase. Herein, FIG. 2 shows an image obtained as follows: the above cutting tool precursor is cut in parallel with a direction normal to a surface of the substrate of the precursor to obtain a cross-sectional sample, and a lamellar phase in a hard particle appearing in this cross-sectional sample is captured with a transmission electron microscope (TEM (trade name: "JEM-2100F" manufactured by JEOL Ltd.)). This microscopic image is captured using a High-Angle Annular Dark-field (HAADF) method, similarly as done for hard particles in the Al-rich layer, as has been described above. Therefore, the microscopic image appears darker at portions having higher atomic ratios of Al. The cross-sectional sample of the cutting tool precursor can also be obtained using a known means, for example, the same as the method for obtaining the cross-sectional sample of the surface-coated cutting tool.

Herein, the third unit phase and the fourth unit phase can be controlled in composition by a ratio at which the source material gases are mixed together. The third unit phase and the fourth unit phase can be controlled in thickness and what cycle is applied to stack them by adjusting each source material gas's flow rate and deposition time. The number of third and fourth unit phases stacked can be controlled by adjusting introduction pipe 8's rotation rate and the deposition time.

[Cooling Operation]

The first step preferably includes a cooling operation. This is because there is a case in which moving the cutting tool precursor may be required to perform each step of the second step, which will be described hereinafter, in a heat treatment furnace (for example, a furnace made of graphite) separate from CVD apparatus 1. A known means is applicable to the cooling operation. For example, temperature control device 5 provided to CVD apparatus 1 can be used to cool substrate 2 set on substrate setting jig 3. Furthermore, the cooling operation may be natural cooling by letting the substrate stand. It is preferable to cool the cutting tool precursor to 300° C. or lower by this cooling operation.

(Second Step)

The method for manufacturing a surface-coated cutting tool according to the present embodiment includes a second step of annealing the lamellar layer to obtain an Al-rich layer. The second step includes a temperature increasing step, an annealing step, and a cooling step. By including these steps, an Al-rich layer including hard particles having a structure in which a second unit phase in the form of a thin line surrounds a first unit phase in the form of a plurality of lumps can be obtained from a layer (a lamellar layer) including hard particles having a lamellar phase.

[Temperature Increasing Step]

The temperature increasing step includes an operation of increasing the temperature of the lamellar layer at a rate of 10° C./min. or more. In the temperature increasing step, for example, after the cutting tool precursor is removed from the CVD apparatus, it is introduced into the above heat treatment furnace (for example, a furnace made of graphite), and the temperature inside the furnace made of graphite is increased to 700° C. or higher and 1200° C. or lower at a rate of 10° C./min. or more. A temperature increasing rate of less than 10° C./min. may result in a poor yield of the Al-rich layer in the annealing step, which will be described hereinafter. The temperature increasing rate is more preferably 15° C./min. or more. The upper limit of the temperature increasing rate is 30° C./min. If the temperature increasing rate exceeds 30° C./min., carburization tends to reduce the surface-coated cutting tool in strength as a whole.

[Annealing Step]

The annealing step includes an operation of annealing the lamellar layer at 700° C. or higher and 1200° C. or lower for 0.1 hour or more and 10 hours or less to obtain an Al-rich layer. In the annealing step, a heat treatment is performed to maintain the cutting tool precursor that is heated to 700° C. or higher and 1200° C. or lower at that temperature for 0.1 hour or more and 10 hours or less. Thus, from the lamellar phase, a structure in which the second unit phase in the form of a thin line surrounds the first unit phase in the form of a plurality of lumps can be obtained. An annealing step performed at a temperature lower than 700° C. and maintained for less than 0.1 hour tends to provide a poor yield of the Al-rich layer. An annealing step performed at a temperature exceeding 1200° C. and maintained for more than 10 hours tends to cause the lamellar phase to make phase transition to a phase having a wurtzite crystal structure. The annealing step is preferably performed at 850° C. or higher and 1100° C. or lower and maintained for 0.5 hour or more and 2 hours or less. Note, however, that while the annealing step is maintained the annealing step may have a fluctuation in temperature within a range of 700° C. to 1200° C., and the fluctuation may temporarily be less than 700° C. or exceed 1200° C. insofar as the present invention exhibits its effect(s).

[Cooling Step]

The cooling step includes an operation of rapidly cooling the Al rich layer at a rate of 20° C./min. or more. In the cooling step, known cooling means can be used insofar as the means can rapidly cool the Al-rich layer at a rate of 20° C./min. or more. For example, the temperature control device with which the above-mentioned graphite furnace is equipped can be used to cool the cutting tool precursor that has undergone the annealing step. In doing so, it is preferable to rapidly cool the cutting tool precursor of 700° C. or higher and 1200° C. or lower to around room temperature (for example, about 50° C.) within 30 minutes, and therefore it is preferable to rapidly cool the Al-rich layer at a rate of 35° C./min. or more. This can form an Al-rich layer uniformly including hard particles having a structure in which the second unit phase in the form of a thin line surrounds the first unit phase in the form of a plurality of lumps. The upper limit of the rate of rapidly cooling the Al-rich layer is 50° C./min. If the rate of rapidly cooling the Al-rich layer exceeds 50° C./min., the thermal stress generated by the difference between the thermal expansion coefficient of the substrate and that of the coating increases the probability of cracking and may lead to reduction in strength of the surface-coated cutting tool as a whole.

In the cooling step, a furnace in cooling preferably has an internal pressure of 0.5 to 0.9 MPa. More preferably, it is 0.6 to 0.8 MPa. When the furnace in cooling has an internal pressure falling within the above range, a coolant gas can be increased in viscosity, and a forced convection can increase the cooling rate.

The method for manufacturing a surface-coated cutting tool according to the present embodiment can form a coating having an Al-rich layer including hard particles as described above, and thus form the coating on the substrate to have high hardness and be also less likely to have initial abrasion. The surface-coated cutting tool can thus be stable and have a long life.

Example

Hereinafter, the present invention will more specifically be described with reference to an example although the present invention is not limited thereto.

In the present example, surface-coated cutting tools of samples 1 to 15 each having a coating different in composition and formed under a different condition were fabricated and evaluated in performance. As will be described hereinafter, samples 1 to 11 correspond to examples, and samples 12 to 15 correspond to comparative examples.

<<Fabricating Surface-Coated Cutting Tools>>

<Preparing the Substrate>

In order to fabricate surface-coated cutting tools of samples 1 to 15, a substrate A shown in Table 1 below was prepared. Specifically, a raw material powder having a blending composition shown in Table 1 was uniformly agitated and press-formed into a predetermined shape, and thereafter sintered at 1300 to 1500° C. for 1 to 2 hours to obtain a cemented carbide substrate having a shape of SEET13T3AGSN-G (manufactured by Sumitomo Electric Hardmetal). SEET13T3AGSN-G is a shape of an indexable cutting insert for milling.

TABLE 1

| | blending composition (mass %) | | | | | |
|---|---|---|---|---|---|---|
| type | Co | VC | $Cr_3C_2$ | NbC | TaC | WC |
| substrate A | 10.0 | — | — | 0.1 | 2.0 | balance |

<Forming the Coating>

(Forming Another Layer)

A coating was formed on a surface of the substrate obtained above. Specifically, using the CVD apparatus shown in FIG. 1, the substrate was set on substrate setting jig 3 and a coating was formed on the substrate through CVD.

For samples 1 to 13, a coating other than the Al rich layer (that is, TiN, TiCN, $Al_2O_3$) was formed under conditions as indicated below in table 2. For each sample (samples 1 to 13), the layers of TiN, TiCN, and $Al_2O_3$ were formed on the substrate with each source material gas deposited in an adjusted period of time so that the layers had thickness as indicated in table 6, which will be described hereinafter. For the substrates of samples 14 and 15, after TiN is formed using the above-described CVD apparatus, an AlTiN film was formed on the substrates through PVD using a target formed of Al and Ti (target composition: Al:Ti=60:40).

TABLE 2

| | | atmosphere for reaction | | |
|---|---|---|---|---|
| type | conditions for deposition reactive gas composition (vol %) | pressure (kPa) | temperature (° C.) | amount of gas in total (L/min.) |
| TiN (underlying layer) | $TiCl_4$ = 2.0%, $N_2$ = 39.7%, $H_2$ = balance | 6.7 | 915 | 44.7 |
| TiCN (intermediate layer) | $TiCl_4$ = 2.0%, $CH_3CN$ = 0.7%, $H_2$ = balance | 9 | 860 | 35.4 |
| $Al_2O_3$ (compound layer) | $AlCl_3$ = 1.6%, $CO_2$ = 4.5%, $H_2S$ = 0.2%, HCl = 3.5%, $H_2$ = balance | 6.7 | 1000 | 32.3 |

The AlTiN film was formed on the substrates of samples 14 and 15 through PVD under the following conditions:
  Arc current: 150 V
  Bias voltage: −40 A
  Chamber's internal pressure: 2.6×10$^{-3}$ Pa
  Reactive gas: nitrogen
  Rotation speed of a rotary table on which the substrate is placed: 10 rpm.
  (Forming the Al-Rich Layer)
  The Al-rich layer was obtained through the above-described step of forming an Al-rich layer. Specifically, it was formed through a first step of forming a lamellar layer through CVD and a second step of annealing the lamellar layer to obtain the Al-rich layer.
  [First Step]
  Initially, a lamellar layer was formed in the first step. As shown in Table 3, the lamellar layer was formed under four conditions of conditions Ti to T4. Under conditions Ti to T3, a mixture gas was made from a first mixture gas including AlCl$_3$ gas, TiCl$_4$ gas and H$_2$ gas, and a second mixture gas including NH$_3$ gas and Ar gas. Under condition T4, a mixture gas was made from a first mixture gas including AlCl$_3$ gas, TiCl$_4$ gas and H$_2$ gas, and in addition thereto, including C$_2$H$_4$ gas, and a second mixture gas including NH$_3$ gas and Ar gas. Under each of conditions Ti to T4, a volume ratio of AlCl$_3$/(AlCl$_3$+TiCl$_4$) in the mixture gas, and conditions of temperature and pressure in CVD apparatus 1 are as shown in table 3.
  In the first step, specifically, the first mixture gas was introduced into CVD apparatus 1 via introduction port 6 to introduction pipe 8, and the second mixture gas was introduced into CVD apparatus 1 via introduction port 7 to introduction pipe 8. Subsequently, introduction pipe 8 was rotated to eject the first mixture gas and the second mixture gas through the through holes of introduction pipe 8. Thereby, a mixture gas in which the first mixture gas and the second mixture gas were uniformly mixed together was obtained, and the mixture gas was deposited on the side of the surface of the substrate to form a lamellar layer.

As shown in table 3, for example under condition T1, there can be formed a lamellar layer in which a third unit phase having a composition of Al$_{0.85}$Ti$_{0.15}$N and a thickness of 3 μm and a fourth unit phase having a composition of Al$_{0.62}$Ti$_{0.38}$N and a thickness of 1 μm are repeatedly stacked with the third and fourth unit phases having an average composition of Al$_{0.8}$Ti$_{0.2}$N.
  In the first step, as shown in Table 6, which will be described hereinafter, for samples 1 to 4, 6 to 8, and 12, a lamellar layer was formed on the substrate under condition T1. For sample 5, a lamellar layer was formed on the substrate under condition T2. For samples 9 and 10, a lamellar layer was formed on the substrate under condition T3. For samples 11 and 13, a lamellar layer was formed on the substrate under condition T4. An image of the lamellar layer (or phase) of sample 1 through a transmission electron microscope is shown in FIG. 2. As the transmission electron microscope, a trade name: "JEM-2100F (manufactured by JEOL Ltd.)" was used.
  [Second Step]
  Further, the second step was performed to anneal the lamellar layer to obtain an Al-rich layer. As shown in Table 4, the Al-rich layer was formed under four conditions of conditions C1 to C4. Under each of conditions C1 to C4, the second step was performed such that the temperature increasing step was performed with a temperature increasing rate, the annealing step was performed with an annealing temperature, an annealing time and an annealing atmosphere, and the cooling step was performed with a cooling rate and the furnace having an internal pressure in cooling, as shown in Table 4.

TABLE 4

| heat treatment condition | condition C1 | condition C2 | condition C3 | condition C4 |
| --- | --- | --- | --- | --- |
| temperature increasing rate (° C./min.) | 10 | 15 | 20 | 10 |

TABLE 3

| | condition T1 | condition T2 | condition T3 | condition T4 |
| --- | --- | --- | --- | --- |
| Temperature (° C.) | 750 | 770 | 700 | 750 |
| Pressure (kPa) | 1 | 1 | 0.5 | 1 |
| AlCl$_3$ (vol %) | 0.78 | 0.78 | 3.0 | 0.78 |
| TiCl$_4$ (vol %) | 0.14 | 0.14 | 0.30 | 0.14 |
| NH$_3$ (vol %) | 1.5 | 1.5 | 1.2 | 1.5 |
| C$_2$H$_4$ (vol %) | 0 | 0 | 0 | 750 |
| Ar (vol %) | 30 | 30 | 24 | 0.2 |
| H$_2$ (vol %) | Balance | Balance | Balance | 29.8 |
| volume ratio of AlCl$_3$/(AlCl$_3$ + TiCl$_4$) | 0.85 | 0.85 | 0.90 | 0.85 |
| average composition | (Al$_{0.8}$Ti$_{0.2}$)N | (Al$_{0.82}$Ti$_{0.18}$)N | (Al$_{0.85}$Ti$_{0.15}$)N | (Al$_{0.8}$Ti$_{0.2}$)CN |
| composition of lamellar layer (3rd unit phase) | (Al$_{0.85}$Ti$_{0.15}$)N | (Al$_{0.85}$Ti$_{0.15}$)N | (Al$_{0.9}$Ti$_{0.1}$)N | (Al$_{0.85}$Ti$_{0.15}$)CN |
| average thickness of lamellar layer (3rd unit phase) (nm) | 3 | 5 | 5 | 3 |
| composition of lamellar layer (4th unit phase) | (Al$_{0.62}$Ti$_{0.38}$)N | (Al$_{0.65}$Ti$_{0.35}$)N | (Al$_{0.60}$Ti$_{0.40}$)N | (Al$_{0.62}$Ti$_{0.38}$)CN |
| average thickness of lamellar layer (4th unit phase) (nm) | 1 | 1 | 1 | 1 |

TABLE 4-continued

| heat treatment condition | condition C1 | condition C2 | condition C3 | condition C4 |
|---|---|---|---|---|
| annealing temperature (° C.) | 900 | 1000 | 1100 | 850 |
| annealing time (min.) | 60 | 30 | 10 | 120 |
| annealing atmosphere | Ar | Ar | Ar | Ar |
| cooling rate (° C./min.) | 40 | 40 | 50 | 30 |
| pressure in furnace in cooling (MPa) | 0.9 | 0.9 | 0.95 | 0.75 |

As shown in Table 4, under condition C1, for example, the lamellar layer was heated at a temperature increasing rate of 10° C./min. and annealed at 900° C. for 60 minutes to obtain an Al-rich layer, and this Al-rich layer was cooled at a cooling rate of 40° C./min. with the furnace having an internal pressure of 0.9 MPa.

In the second step, as shown in Table 6 described hereinafter, samples 1 and 5 had their lamellar layers subjected to condition C1 to obtain an Al-rich layer. Samples 2 and 6-8 had their lamellar layers subjected to condition C2 to obtain an Al-rich layer. Samples 3, 9 and 10 had their lamellar layers subjected to condition C3 to obtain an Al-rich layer. Sample 11 had its lamellar layer subjected to condition C4 to obtain an Al-rich layer. Samples 12 and 13 did not have their lamellar layers subjected to the second step. Sample 14 also did not have its PVD-formed AlTiN film subjected to the second step. Note, however, that sample 15 had its PVD-formed AlTiN film subjected to a heat treatment such that it was heated, annealed and cooled under condition C1. An image of hard particles in the Al rich layer of sample 1 through a transmission electron microscope is shown in FIG. 3. As the transmission electron microscope, a trade name: "JEM-2100F (manufactured by JEOL Ltd.)" was used.

(Surface Treatment)

Further, samples 7 and 8 were subjected to a surface treatment by shot blasting under conditions, respectively, shown in Table 5 to apply compressive stress to their coatings.

TABLE 5

| type | media | particle diameter (μm) | pressure of incidence (Mpa gauge) | angle of incidence (degrees) | time of incidence (seconds) | position of incidence | environment for incidence |
|---|---|---|---|---|---|---|---|
| α | $Al_2O_3/H_2O$ | 100 | 0.2 | 45 | 10 | ridge of cutting edge | wet |
| β | $SiO_2$—$Al_2O_3$ | 50 | 0.08 | 90 | 5 | rake face | dry |

By forming a coating on each substrate as described above, surface-coated cutting tools for samples 1 to 15 were fabricated. They are listed in table 6. Table 6 indicates that, for example, sample 1 is a surface-coated cutting tool in which a 1 μm thick TiN layer was formed directly on substrate A as an underlying layer and a 10 μm thick Al-rich layer was formed on the TiN layer. The surface-coated cutting tool of sample 1 has an Al-rich layer obtained by annealing under condition C1 a lamellar layer formed under condition T1.

Further, the table indicates that, for example, sample 9 is a surface-coated cutting tool in which a 1 μm thick TiN layer was formed directly on substrate A as an underlying layer, a 3 μm thick $Al_2O_3$ layer was formed on the TiN layer, and a 5 μm thick Al-rich layer was formed on the $Al_2O_3$ layer. The surface-coated cutting tool of sample 9 has an Al-rich layer obtained by annealing under condition C3 a lamellar layer formed under condition T3. The table indicates that, for example, sample 10 is a surface-coated cutting tool in which a 0.5 μm thick TiN layer was formed directly on substrate A as an underlying layer, a 2 μm thick TiCN layer was formed on the TiN layer, a 2 μm thick $Al_2O_3$ layer was formed on the TiCN layer, and a 5 μm thick Al rich layer was formed on the $Al_2O_3$ layer. The surface-coated cutting tool of sample 10 has an Al-rich layer obtained by annealing under condition C3 a lamellar layer formed under condition T3.

TABLE 6

| examples/ comparative examples | base material | TiN (μm) | TiCN (μm) | Al-rich layer (μm) | $Al_2O_3$ (μm) | Al-rich layer (μm) | surface treatment |
|---|---|---|---|---|---|---|---|
| sample 1 | A | 1 | — | 10 (T1 + C1) | — | — | — |
| sample 2 | A | 1 | — | 10 (T1 + C2) | — | — | — |

TABLE 6-continued

| examples/ comparative examples | base material | TiN (μm) | TiCN (μm) | Al-rich layer (μm) | Al₂O₃ (μm) | Al-rich layer (μm) | surface treatment |
|---|---|---|---|---|---|---|---|
| sample 3 | A | 1 | — | 10 (T1 + C3) | — | — | — |
| sample 4 | A | 1 | — | 10 (T1 + C4) | — | — | — |
| sample 5 | A | 1 | — | 10 (T2 + C1) | — | — | — |
| sample 6 | A | 0.5 | 2.5 | 5.5 (T1 + C2) | — | — | — |
| sample 7 | A | 0.5 | 2.5 | 5.5 (T1 + C2) | — | — | α |
| sample 8 | A | 0.5 | 2.5 | 5.5 (T1 + C2) | — | — | β |
| sample 9 | A | 1 | — | — | 3 | 5 (T4 + C4) | — |
| sample 10 | A | 0.5 | 2 | — | 2 | 5 (T4 + C4) | — |
| sample 11 | A | 1 | — | 10 (T3 + C3) | — | — | — |
| sample 12 | A | 1 | — | 10 (T1) | — | — | — |
| sample 13 | A | 1 | — | 10 (T4) | — | — | — |
| sample 14 | A | 1 | | PVD | | | |
| sample 15 | A | 1 | | PVD + C1 | | | |

<<Evaluating Surface-Coated Cutting Tools>>
<Observing Al-Rich Layer>

Initially, the surface-coated cutting tools of samples 1 to 11 each had the Al-rich layer analyzed through X-ray diffraction in a direction normal to a surface of the coating to examine which crystal plane presented a maximum diffraction peak. As a result, the Al-rich layer of the surface-coated cutting tool of each of samples 1 to 11 presented a maximum diffraction peak at the (220) plane. For example, FIG. 5 shows a result of X-ray diffraction of the Al-rich layer in the surface-coated cutting tool of sample 1. It is expected that the surface-coated cutting tools of samples 1 to 11 are excellent in abrasion resistance and fracture resistance and can exhibit excellent performance for applications, such as a heat-resistant alloy or a similar hard-to-cut material, requiring cutting, and a casting or the like, requiring intermittent working.

Furthermore, the surface-coated cutting tools of samples 1 to 11 had their Al-rich layers observed with the above-described transmission microscope, and subjected to an elemental analysis with an EDX with which the transmission microscope was equipped. Thereby, atomic ratio x of Al of peaks in the first unit phase of the Al rich layer (as averaged), atomic ratio y of Al of valleys in the second unit phase of the Al rich layer (as averaged), and the first unit phase's size in the <100> orientation (as averaged) were measured. A result thereof is shown in table 7. In addition, the surface-coated cutting tools of samples 1 to 11 had their coatings examined for strength (or indentation hardness) in the method described above. A result thereof is also shown in table 7.

The surface-coated cutting tools of samples 12 to 15 had no Al-rich layer, and accordingly, they were not subjected to an analysis through X-ray diffraction, an elemental analysis with EDX, or a measurement in size of the first unit phase in the <100> orientation, as described above. Note, however, that the surface-coated cutting tools of samples 12 to 15 had their coatings evaluated for strength (or indentation hardness) in the method described above. A result thereof is shown in table 7.

Note that, as shown in Table 6 described above, sample 12 is a surface-coated cutting tool in which substrate A coated with a TiN layer serving as an underlying layer was only subjected to condition T1 to form a coating, and sample 13 is a surface-coated cutting tool in which substrate A coated with a TiN layer serving as an underlying layer was only subjected to condition T4 to form a coating. Sample 14 is a surface-coated cutting tool in which substrate A coated with a TiN layer serving as an underlying layer was subjected to the above described, conditioned PVD to form an AlTiN layer, and sample 15 is a surface-coated cutting tool in which substrate A coated with a TiN layer serving as an underlying layer was subjected to the above described, conditioned PVD to form an AlTiN layer and subsequently underwent a heat treatment under condition C1 to form a coating.

TABLE 7

| | sample 1 | sample 2 | sample 3 | sample 4 | sample 5 | sample 6 | sample 7 |
|---|---|---|---|---|---|---|---|
| atomic ratio x of Al of peaks (average value) | 0.87 | 0.9 | 0.92 | 0.86 | 0.88 | 0.92 | 0.89 |
| atomic ratio y of Al of valleys (average value) | 0.6 | 0.57 | 0.52 | 0.6 | 0.62 | 0.56 | 0.58 |

TABLE 7-continued

|  | | | | | | | |
|---|---|---|---|---|---|---|---|
| size of 1st unit phase in <100> orientation (average value) (nm) | 4 | 4.5 | 7.5 | 3.5 | 5.5 | 5.0 | 4.7 |
| coating' hardness (GPa) | 38 | 42 | 40 | 39 | 40 | 41 | 43 |

|  | sample 8 | sample 9 | sample 10 | sample 11 | sample 12 | sample 13 | sample 14 | sample 15 |
|---|---|---|---|---|---|---|---|---|
| atomic ratio x of Al of peaks (average value) | 0.9 | 0.92 | 0.93 | 0.88 | — | — | — | — |
| atomic ratio y of Al of valleys (average value) | 0.57 | 0.55 | 0.55 | 0.58 | — | — | — | — |
| size of 1st unit phase in <100> orientation (average value) (nm) | 4.5 | 10 | 9.7 | 4 | — | — | — | — |
| coating' hardness (GPa) | 42 | 36 | 36 | 40 | 34 | 34 | 30 | 28 |

From Table 7, for example, sample 1 has an Al-rich layer composed of hard particles having a first unit phase presenting a peak with an atomic ratio x of Al of 0.87 (that is, $Al_{0.87}Ti_{0.13}N$) and a second unit phase presenting a valley with an atomic ratio y of Al of 0.6 (that is, $Al_{0.6}Ti_{0.4}N$). Furthermore, the first unit phase has a size of 4 nm in the <100> orientation. Sample 1 had an Al-rich layer with the coating having a strength (or indentation hardness) of 38 GPa.

Furthermore, according to Table 7, samples 1 to 11 each had an Al-rich layer with the coating superior in strength to samples 12 to 15.

<Cutting Test>

Subsequently, the surface-coated cutting tools of samples 1 to 15 underwent a cutting test (an abrasion resistance test) under the following cutting conditions: Specifically, the surface coated cutting tools of samples 1 to 15 (shape: SEET13T3AGSN-G) were used under conditions as indicated below to measure a cuttable time before the cutting tools had a flank face worn by an amount (Vb) of 0.30 mm. A result thereof is shown in table 8. The table shows that a surface-coated cutting tool having a longer cuttable time suppresses initial abrasion and thus has larger abrasion resistance.

<Cutting Conditions>

Workpiece: FCD block material

Cutter: WGC4160R (manufactured by Sumitomo Electric Hardmetal)

Peripheral speed: 500 m/min.

Feed rate: 0.3 mm/second

Cutting depth: 1.0 mm

Cutting fluid: None

TABLE 8

| examples/comparative examples | cuttable time |
|---|---|
| sample 1 | 20 |
| sample 2 | 22 |
| sample 3 | 22 |
| sample 4 | 18 |
| sample 5 | 20 |
| sample 6 | 28 |
| sample 7 | 30 |
| sample 8 | 35 |
| sample 9 | 26 |
| sample 10 | 27 |
| sample 11 | 12 |
| sample 12 | 10 |
| sample 13 | 10 |
| sample 14 | 6 |
| sample 15 | 3 |

From Table 8, when the surface-coated cutting tools of samples 1 to 11 (or the examples) are compared with the surface-coated cutting tools of samples 12 to 15 (or comparative examples), it can be seen that the former suppress initial abrasion more and thus have larger abrasion resistance.

Thus while embodiments and examples of the present invention have been described, it is also initially planned to combine configurations of the embodiments and examples, as appropriate.

It should be understood that the embodiments and examples disclosed herein have been described for the purpose of illustration only and in a non-restrictive manner in any respect. The scope of the present invention is defined by the terms of the claims, rather than the description above, and is intended to include any modifications within the meaning and scope equivalent to the terms of the claims.

REFERENCE SIGNS LIST

1 CVD apparatus, 2 substrate, 3 substrate setting jig, 4 reaction chamber, 5 temperature control device, 6, 7 introduction port, 8 introduction pipe, 9 exhaust pipe, 10 exhaust port.

The invention claimed is:

1. A surface-coated cutting tool comprising a substrate and a coating formed on a surface of the substrate,
   the coating including one or two or more layers,
   at least one of the layers being an Al-rich layer including hard particles,
   the hard particle having a sodium chloride type crystal structure, and including a first unit phase in a form of a plurality of lumps and a second unit phase interposed between the lumps of the first unit phase,
   the first unit phase being composed of a nitride or carbonitride of $Al_xTi_{1-x}$,
   the first unit phase having an atomic ratio x of Al of 0.7 or more and 0.96 or less,
   the second unit phase being composed of a nitride or carbonitride of $Al_yTi_{1-y}$,
   the second unit phase having an atomic ratio y of Al exceeding 0.5 and less than 0.7,
   the Al-rich layer exhibiting a maximum peak in the (220) plane when the Al-rich layer is analyzed through X-ray diffraction in a direction normal to a surface of the coating,
   the hard particle internally having a structure in which the second unit phase in a form of a thin line surrounds the first unit phase in the form of the plurality of lumps.

2. The surface-coated cutting tool according to claim 1, wherein the hard particles occupy 50% by volume or more of the Al-rich layer.

3. The surface-coated cutting tool according to claim 1, wherein the first unit phase in its <100> orientation has a size of 2 nm or more and 15 nm or less.

4. A method for manufacturing a surface-coated cutting tool including a substrate and a coating formed on a surface of the substrate,
   the coating including one or two or more layers,
   at least one of the layers being an Al-rich layer including hard particles,
   the Al-rich layer exhibiting a maximum peak in the (220) plane when the Al-rich layer is analyzed through X-ray diffraction in a direction normal to a surface of the coating, the method comprising the steps of:
   forming the Al-rich layer,
   the step of forming the Al-rich layer including
       a first step of forming a lamellar layer through CVD, and
       a second step of annealing the lamellar layer to obtain the Al-rich layer,
   the second step including a temperature increasing step, an annealing step, and a cooling step,
   the temperature increasing step including an operation of increasing the temperature of the lamellar layer at a rate of 10° C./min or more,
   the annealing step including an operation of annealing the lamellar layer at 700° C. or higher and 1200° C. or lower for 0.1 hour or more and 10 hours or less to obtain the Al-rich layer,
   the cooling step including an operation of rapidly cooling the Al rich layer at a rate of 20° C./min or more and 50° C./min. or less.

5. The method for manufacturing a surface-coated cutting tool according to claim 4, wherein
   the first step includes
       a first operation of obtaining a mixture gas by mixing a first mixture gas and a second mixture gas at a temperature ranging from 650° C. to 850° C. with a pressure ranging from 0.5 kPa to 1.5 kPa applied and
       a second operation of ejecting the mixture gas toward a surface of the substrate at the temperature with the pressure applied to form the lamellar layer, and
   the first mixture gas includes $AlCl_3$ gas, $TiCl_4$ gas, and $H_2$ gas and
   the second mixture gas includes $NH_3$ gas and Ar gas.

6. The method for manufacturing a surface-coated cutting tool according to claim 4, wherein
   the lamellar layer includes a third unit phase and a fourth unit phase,
   the third unit phase and the fourth unit phase are stacked alternately,
   the third unit phase is composed of a nitride or carbonitride of $Al_sTi_{1-s}$,
   the third unit phase has an atomic ratio s of Al of 0.7 or more and 0.95 or less,
   the fourth unit phase is composed of a nitride or carbonitride of $Al_tTi_{1-t}$, and
   the fourth unit phase has an atomic ratio t of Al of 0.5 or more and less than 0.7.

* * * * *